United States Patent
Liang et al.

(10) Patent No.: US 9,299,571 B2
(45) Date of Patent: Mar. 29, 2016

(54) COMPOSITIONAL GRADED IGZO THIN FILM TRANSISTOR

(71) Applicant: Intermolecular, Inc., San Jose, CA (US)

(72) Inventors: Haifan Liang, Fremont, CA (US); Sang Lee, San Jose, CA (US); Jeroen Van Duren, Palo Alto, CA (US)

(73) Assignee: Intermolecular, Inc., San Jose, CA (US)

( * ) Notice: Subject to any disclaimer, the term of this patent is extended or adjusted under 35 U.S.C. 154(b) by 161 days.

(21) Appl. No.: 14/134,678

(22) Filed: Dec. 19, 2013

(65) Prior Publication Data

US 2014/0264320 A1    Sep. 18, 2014

Related U.S. Application Data

(60) Provisional application No. 61/778,986, filed on Mar. 13, 2013.

(51) Int. Cl.

| | |
|---|---|
| *H01L 21/00* | (2006.01) |
| *H01L 27/12* | (2006.01) |
| *H01L 21/306* | (2006.01) |
| *H01L 21/02* | (2006.01) |
| *H01L 29/66* | (2006.01) |
| *H01L 29/786* | (2006.01) |
| *H01L 21/465* | (2006.01) |
| *H01L 21/70* | (2006.01) |
| *H01L 29/45* | (2006.01) |

(52) U.S. Cl.
CPC .... *H01L 21/30604* (2013.01); *H01L 21/02565* (2013.01); *H01L 21/02631* (2013.01); *H01L 21/465* (2013.01); *H01L 21/707* (2013.01); *H01L 27/1225* (2013.01); *H01L 27/1262* (2013.01); *H01L 29/45* (2013.01); *H01L 29/66969* (2013.01); *H01L 29/7869* (2013.01)

(58) Field of Classification Search
CPC . H01L 29/24; H01L 29/7869; H01L 27/1225; H01L 21/00; H01L 21/16; H01L 21/479
USPC .......................................................... 257/43
See application file for complete search history.

(56) References Cited

U.S. PATENT DOCUMENTS

| | | | |
|---|---|---|---|
| 8,193,531 B2 | 6/2012 | Ishikawa et al. | |
| 8,546,892 B2 * | 10/2013 | Imoto et al. | 257/407 |
| 2009/0236597 A1 | 9/2009 | Ye | |
| 2011/0215331 A1 | 9/2011 | Yamazaki et al. | |
| 2013/0089940 A1 | 4/2013 | Arai et al. | |

OTHER PUBLICATIONS

Iwasaki et al.; Combinatorial approach to thin-film transistors using multicomponent semiconductor channels: An application to amorphous oxide semiconductors in In—Ga—Zn—O system; Jun. 15, 2007; Applied Physics Letters; American Institute of Physics; pp. 242114-1-242114-3.

(Continued)

*Primary Examiner* — Monica D Harrison

(57) ABSTRACT

A gradient in the composition of at least one of the elements of a metal-based semiconductor layer is introduced as a function of depth through the layer. The gradient(s) influence the current density response of the device at different gate voltages. In some embodiments, the composition of an element (e.g. Ga) is greater at the interface between the metal-based semiconductor layer and the source/drain layers. The shape of the gradient profile is one of linear, stepped, parabolic, exponential, and the like.

20 Claims, 9 Drawing Sheets

(56) References Cited

OTHER PUBLICATIONS

Huh et al.; Effects of the Composition of Sputtering Target on the Stability of InGaZnO Thin Film Transistor; Mar. 4, 2011; Thin Solid Films; Elsevier B.V.; pp. 6868-6871.

Rha et al.; Performance Variation According to Device Structure and the Source/Drain Metal Electrode of a-IGZO TFTs; Dec. 2012; IEEE Transactions on Electron Devices, vol. 59, No. 12; IEEE; pp. 3357-3363.4

* cited by examiner

US 9,299,571 B2

COMPOSITIONAL GRADED IGZO THIN FILM TRANSISTOR

CROSS-REFERENCE TO RELATED APPLICATIONS

This application claims priority to U.S. Provisional Application Ser. No. 61/778,986 filed on Mar. 13, 2013, which is herein incorporated by reference for all purposes.

TECHNICAL FIELD

The present disclosure relates generally to methods of forming semiconductor channel layers for use in thin film transistors (TFTs) used in display applications.

BACKGROUND

TFTs are employed as switching and/or driving devices in many electronic circuits. As an example, TFTs are used as control devices for pixels in display applications such as flat panel displays (FPD), whether based on active-matrix-liquid-crystal displays (AMLCD), or active-matrix-organic-light-emitting-displays (AMOLED). These FPD are used in televisions, computer monitors, smart phones, tablets, etc. Traditionally, TFTs based on amorphous silicon technology (a-Si) have been used due to the low cost and ease of manufacture. However, a-Si-based TFTs have a number of issues such as low mobility, low ON/OFF current ratios (e.g. higher power), and limited durability. Additionally, TFTs based on a-Si are not transparent, thereby limiting the size of the TFT within the pixel so that the display characteristics are not compromised. With the market moving to higher resolution, higher refresh rate, lower power consumption, lower cost, and larger displays, there is a need to replace a-Si.

Metal-based semiconductor materials (e.g. metal oxides, metal oxy-nitrides, metal oxy-chalcogenides, metal chalcogenides) are candidates for replacing a-Si in display applications. The metal-based semiconductor materials may be amorphous, crystalline, or polycrystalline. The metal-based semiconductor materials include multiple elements. Some examples of metal-based semiconductor materials include those based on In—Ga—Zn—O (IGZO) and related materials, like In—Zn—O (IZO), Zn—Sn—O (ZTO), Hf—In—Zn—O (HIZO), and Al—Zn—Sn—O (AZTO). Some examples of metal oxy-nitrides include Zn—O—N (ZnON), In—O—N (InON), Sn—O—N (SnON). Examples of crystalline metal-based semiconductor materials include c-axis aligned crystalline (CAAC) materials like CAAC-IGZO, or polycrystalline materials like ZnO and In—Ga—O (IGO). In addition to the application of these materials into TFTs, these materials are also being considered for memory (e.g. non-volatile random access memory (RAM)), sensor applications (e.g. image sensors), and central processing units (CPU). Some of these materials exhibit stable amorphous phases, high mobility (e.g. >5 cm$^2$/Vs), low threshold voltage (close to zero, e.g. in a range of −1.0V to +2.0V), low carrier concentrations (e.g. $10^{16}$-$10^{17}$ cm$^{-3}$), high ON/OFF current ratios (e.g. >$10^6$), and high durability (e.g. negative bias temperature illumination stress NBTIS with threshold voltage shift in a range of −1.5V to +0.5V). However, since these materials are multinary compounds (e.g. three or more elements), their performance and properties are sensitive to factors such as composition, concentration gradients, deposition parameters, post-deposition treatments, interactions with adjacent materials, and the like. Further, since the electrical, physical, and chemical behavior of these materials is difficult or impossible to model, much of the development and optimization must be accomplished empirically. Comprehensive evaluation of the entire composition range and deposition parameter space for the formation of a TFT device utilizing these materials requires thousands or millions of experiments.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, a gradient in the composition of at least one of the elements of a metal-based semiconductor layer is introduced as a function of depth (e.g. from a lower surface to an upper surface of the layer) through the layer. The gradient(s) influence the current density response of the device at different gate voltages. In some embodiments, the composition of Ga is greater at the interface between the metal-based semiconductor layer and the source/drain layers. In some embodiments, the shape of the gradient profile is one of linear, stepped, parabolic, exponential, and the like.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
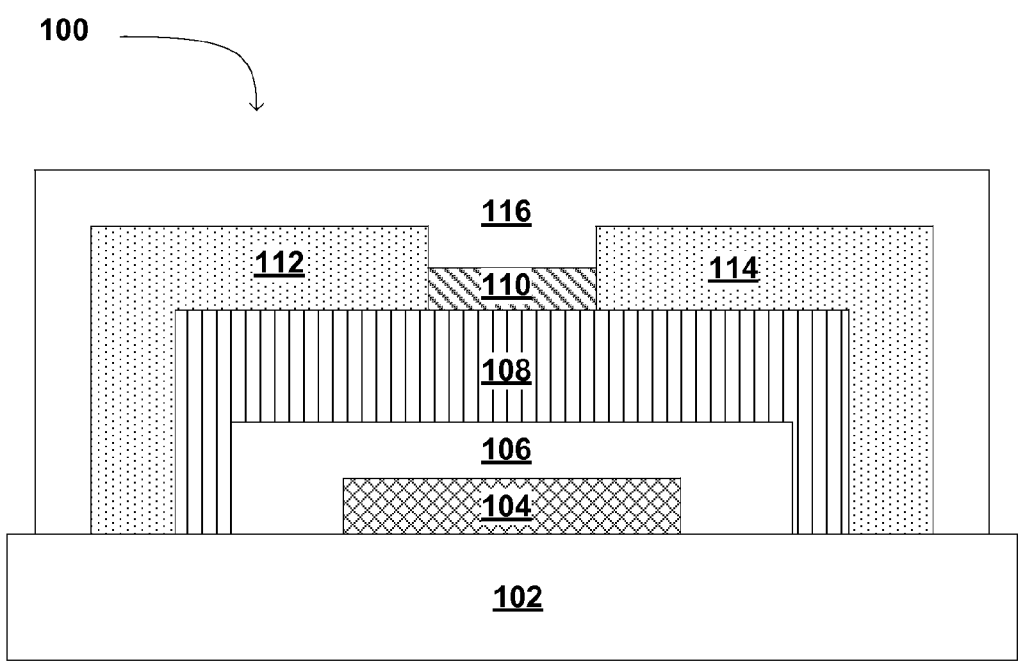
FIG. 1 is a simplified cross-sectional view of a TFT according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed.

Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "an" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" or "substantially the same" is used, the two quantities may vary from each other by no more than 5%.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

As used herein, a material (e.g. a dielectric material or an electrode material) will be considered to be "crystalline" if it exhibits greater than or equal to 30% crystallinity as measured by a technique such as x-ray diffraction (XRD).

Those skilled in the art will appreciate that each of the layers discussed herein and used in the TFT may be formed using any common formation technique such as physical vapor deposition (PVD), atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD) or evaporation. Generally, because of the morphology and size of the display devices, PVD or PECVD are preferred methods of formation. However, any of these techniques are suitable for forming each of the various layers discussed herein. Those skilled in the art will appreciate that the teachings described herein are not limited by the technology used for the deposition process.

Figure 3:
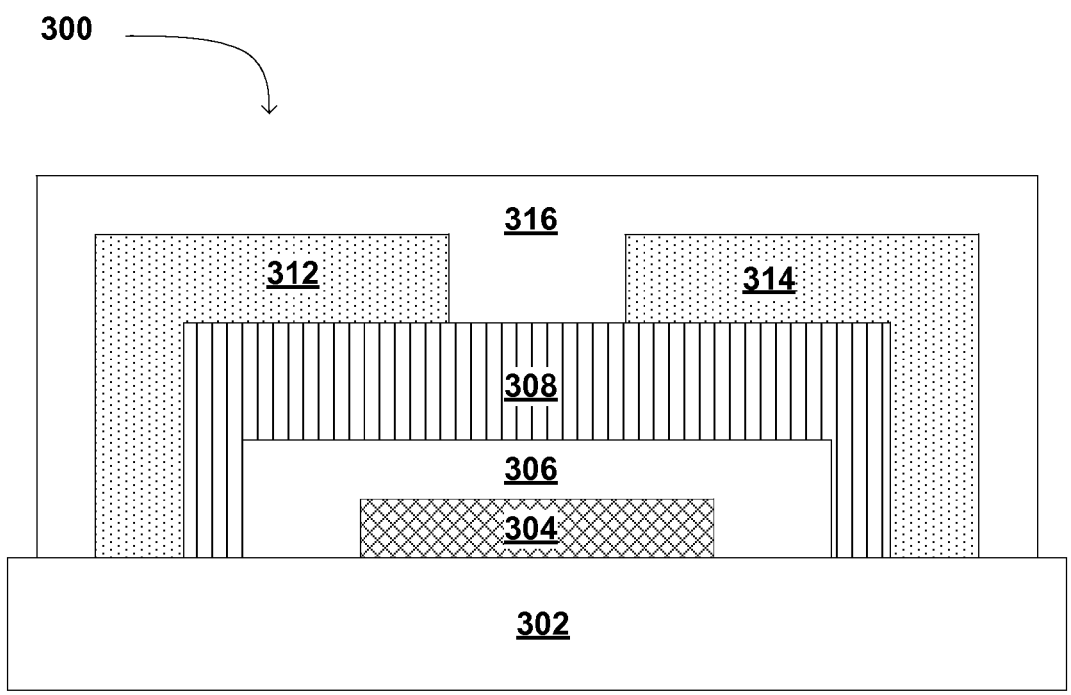
FIG. 3 is a simplified cross-sectional view of a TFT according to some embodiments.

In FIGS. 1 and 3, a TFT stack is illustrated using a simple inverted-staggered, bottom-gate, with etch-stopper island, device structure. Those skilled in the art will appreciate that the description and teachings herein can be readily applied to any simple or complex TFT structure, including inverted-staggered, bottom-gate, back-channel-etch device structures, co-planar device structures, inverted-staggered, bottom-gate, etch-stopper contact (via) hole device structures, self-aligned, inverted-staggered, bottom-gate, etch-stopper island device structures, and various device structures based on top-gate, bottom-gate, staggered, inverted-staggered, co-planar, back-channel-etch, single-gate, or double-gate features. The drawings are for illustrative purposes only and do not limit the application of the present disclosure.

As used herein, the notation "(IIIA)" will be understood to represent the sum of the concentrations of all Group-IIIA elements. This notation will be used herein in calculations of the composition ratios of various elements. This notation will be understood to extend to each of the other Groups of the periodic table respectively (e.g. "(IA)", "(IIA)", "(IVA)", "(VIA)", "(IB)", "(IIB)", etc.).

As used herein, the notation "In—Ga—Zn—O" will be understood to include a material containing these elements in any ratio. This notation will be shortened to "IGZO" for brevity. Where a specific composition is discussed, the atomic concentrations (or ranges) will be provided. The notation is extendable to other materials and other elemental combinations.

As used herein, the notation "$In_xGa_yZn_zO_w$" will be understood to include a material containing these elements in a specific ratio given by x, y, z, and w (e.g. $In_{33}Ga_{33}Zn_{33}$ contains 33 atomic % In, 33 atomic % Ga, and 33 atomic % Zn). The notation is extendable to other materials and other elemental combinations.

As used herein, the notation "$(In,Ga)_x(Zn,Cd)_y(O,Se,S,Te)_z$" will be understood to include a material containing a total amount of Group-IIA elements (i.e. In plus Ga, etc.) in a ratio given by "x", a total amount of Group-IIB elements (i.e. Zn plus Cd, etc.), etc. in a ratio given by "y", and a total amount of Group-VIA elements (i.e. O plus Se plus S plus Te, etc.) in a ratio given by "z". The notation is extendable to other materials and other elemental combinations.

As used herein, the term "stack" will be understood to refer to a collection of two or more layers. Typically, the layers are arranged vertically when viewed in a cross-sectional view of the device. Each layer within a stack does not have to cover the entire surface of the layer(s) below it (e.g. the various layers are generally patterned with respect to each other).

As used herein, the terms "film" and "layer" will be understood to represent a portion of a stack. They will be understood to cover both a single layer as well as a multilayered structure (i.e. a nanolaminate). As used herein, these terms will be used synonymously and will be considered equivalent.

As used herein, "substrate" will be understood to generally be one of float glass, low-iron glass, borosilicate glass, display glass, alkaline earth boro-aluminosilicate glass, fusion drawn glass, flexible glass, specialty glass for high temperature processing, polyimide, plastics, polyethylene terephthalate (PET), etc. for either applications requiring transparent or non-transparent substrate functionality. For substrates with no need for transparency, substrates like aluminum foil, stainless steel, carbon steel, paper, cladded foils, etc. can be utilized.

The typical materials in a TFT stack consist of a substrate, a diffusion barrier layer, a gate electrode, source electrode, drain electrode, gate insulator, and a semiconducting channel layer, in addition to an optional etch stopper and/or passivation layer. As used herein, "metal-based semiconductor layer", and "metal-based semiconductor material", etc. will be understood to be equivalent and be understood to refer to a layer and/or material related to the channel layer. This disclosure will describe methods and apparatus for forming and evaluating at least portions of TFT devices based on metal-based semiconductor materials. The metal-based semiconductor materials may include at least one of metal oxides, metal oxy-nitrides, metal oxy-chalcogenides, or metal chalcogenides. In—Ga—Zn—O (IGZO), will be used as an example of a metal-based semiconductor material for purposes of illustration, but this is not intended to be limiting. Those skilled in the art will understand that the present disclosure can be applied to any suitable metal-based semiconductor material applicable to TFT devices.

As used herein, "single grading" and "single gradient" will be understood to describe cases wherein a parameter (e.g. element concentration) varies throughout the thickness of a film or layer and further exhibits a smooth variation. Examples of suitable parameters used herein will include the atomic concentration of a specific elemental species (i.e. composition variation) throughout the thickness of a film or layer, and bandgap energy variation throughout the thickness of a film or layer.

As used herein, "double grading" and "double gradient" will be understood to describe cases wherein a parameter (e.g. element concentration) varies throughout the thickness of a film or layer and further exhibits a variation wherein the value of the parameter is smaller toward the middle of the film or layer with respect to either end of the film or layer. It is not a requirement that the value of the parameter be equivalent at the two ends of the film or layer. Examples of suitable parameters used herein will include the atomic concentration of a specific elemental species (i.e. composition variation) throughout the thickness of a film or layer, and bandgap energy variation throughout the thickness of a film or layer.

FIG. 1 is a simplified cross-sectional view of a TFT according to some embodiments. Bottom gate electrode, 104, is formed above substrate, 102. As discussed previously, the substrate may be any commonly used substrate for display devices such as one of float glass, low-iron glass, borosilicate glass, display glass, alkaline earth boro-aluminosilicate glass, fusion drawn glass, flexible glass, specialty glass for high temperature processing, polyimide, plastics, PET, etc. for either applications requiring transparent or non-transparent substrate functionality. For substrates with no need for transparency, substrates like aluminum foil, stainless steel, carbon steel, paper, cladded foils, etc. can be utilized. The substrate optionally is covered by a diffusion barrier, (e.g. silicon oxide, silicon nitride, or silicon oxy-nitride). The bottom gate electrode, 104, is typically formed by a deposition process followed by a patterning process. Optionally, an anneal step is implemented prior to patterning, post patterning, or both. A typical deposition method involves sputter deposition. Patterning is typically performed by photolithography. The photolithography most commonly relies on wet etching, yet dry etching (e.g. reactive ion etching) can be used as well. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The gate electrode is most commonly a stack of two or more layers. Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode.

Gate dielectric, 106, is formed above bottom gate electrode, 104. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The gate dielectric, 106, is typically formed by a deposition process followed by a patterning process. Optionally, an anneal step is implemented prior to patterning, post patterning, or both. The gate dielectric, 106, may be formed using deposition techniques such as PVD, ALD, or PECVD, or a combination thereof. The performance of the gate dielectric can be sensitive to composition and process parameters. The gate dielectric, 106, may be patterned using either wet techniques such as chemical etching, or dry techniques such as reactive ion etching (RIE). In both of these techniques, parameters such as the uniformity, etch rate, selectivity, critical dimension loss, taper angle, cost, throughput, etc. are sensitive to the process parameters of the etch process.

Metal-based semiconductor layer, 108, is formed above gate dielectric, 106. The metal-based semiconductor layer, 108, is typically formed by a deposition process followed by a patterning process. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the metal-based semiconductor layer may be treated prior to etch stopper or source/drain deposition with a plasma containing $O_2$ or $N_2O$. The metal-based semiconductor layer, 108, may be formed using deposition techniques such as PVD, MOCVD, or wet depositions, (e.g. based on sol-gels). The performance of the metal-based semiconductor layer can be sensitive to composition and process parameters. Examples of suitable materials for the metal-based semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N (SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in the metal-based semiconductor material (e.g. IGZO) may be partially or completely replaced by Ag, As, Au, Bi, Cd, Cu, Zn, Ga, Ge, Hg, In, Pb, Sb, Sn, and Tl. Other dopants of interest include halogens like Cl and F. The metal-based semiconductor layer, 108, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process. This disclosure will use IGZO as an example, but this is not meant to be limiting. The techniques described herein can be applied to any material suitable for display applications.

Etch stopper, 110, is formed above metal-based semiconductor layer, 108. The etch stopper, 110, is typically formed by a deposition process followed by a patterning process. Optionally, an anneal step is implemented prior to patterning, post patterning, or both. The etch stopper, 110, may be formed using deposition techniques such as PVD, ALD, PECVD, or by wet coating techniques. The performance of the etch stopper can be sensitive to composition and process parameters. Examples of suitable materials for the etch stopper include silicon oxide, silicon nitride, a stack of silicon nitride and silicon oxide, a mixture, multi-layer, or combination thereof of a high bandgap material (e.g. silicon oxide, or aluminum oxide) and high-k dielectric material (e.g. hafnium oxide, zirconium oxide, titanium oxide), a high bandgap (e.g. silicon oxide, or aluminum oxide) or high-k dielectric material (e.g. hafnium oxide, zirconium oxide, titanium oxide). In addition to these inorganic materials, various organic materials may be used as etch stopper materials as well. Examples of organic etch stopper materials include photoresist, organic polymers, UV-curable polymers, and heat-curable polymers. The etch stopper, 110, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

Source and drain electrodes, 112 and 114, are formed above etch stopper, 110 and exposed regions of the metal-based semiconductor layer, 108. The source and drain electrodes, 112 and 114, are typically formed by a deposition process followed by a patterning process. Optionally, an anneal step is implemented prior to patterning, post patterning, or both. The source and drain electrodes, 112 and 114, may be formed using deposition techniques such as PVD, wet deposition (e.g. plating), or MOCVD (for TCOs). Typically, the deposition steps involve sputter deposition. Patterning is commonly performed by photolithography. The photolithography most commonly relies on wet etching, yet dry etching (e.g. reactive ion etching) can be used as well. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The performance of the source and drain electrodes can be sensitive to composition and process parameters. The source/drain electrode is most commonly a stack of two or more layers. Examples of suitable materials for the bottom source/drain electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The source and drain electrodes, 112 and 114, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

Passivation layer, 116, is formed above source and drain electrodes, 112 and 114. The passivation layer, 116, is typically formed by a deposition process followed by a patterning process. Optionally, an anneal step is implemented prior to patterning, post patterning, or both. The passivation layer, 116, may be formed using deposition techniques such as PVD, ALD, or PECVD, or by wet coating techniques. The performance of the passivation layer can be sensitive to composition and process parameters. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer, 116, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

In some embodiments, between one or more of the deposition and patterning steps discussed previously (e.g. the formation of the gate electrode layer, the gate dielectric layer, the metal-based semiconductor layer, the etch stopper layer, the source/drain electrode layers, or the passivation layer), the surface of the deposited film may be subjected to a treatment process before the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

Figure 2:
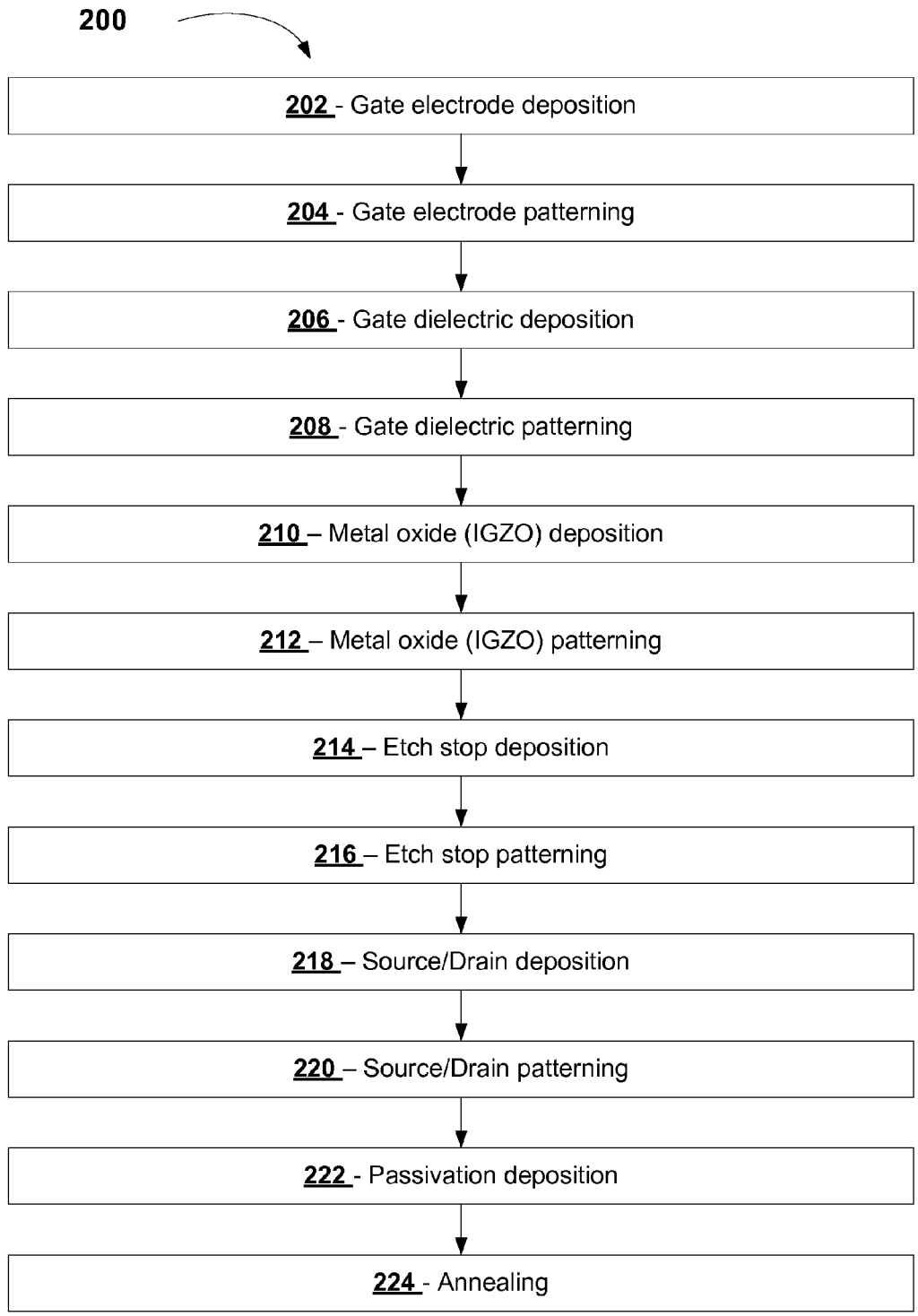
FIG. 2 is a flow chart illustrating the steps of a method according to some embodiments.

FIG. 2 is a flow chart illustrating the steps of a method according to some embodiments. In step 202, a gate electrode layer is deposited above the substrate. Typically, the gate electrode is a material with high conductivity such as a metal, metal alloy, or conductive metal compound (e.g. titanium nitride, tantalum nitride, and the like). Examples of suitable materials for the gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode. The gate electrode layer can be deposited using well known deposition techniques such as PVD, CVD, PECVD, PLD, evaporation, etc.

In step 204, the gate electrode layer is patterned. The gate electrode layer is patterned using known photolithography techniques followed by etching the gate electrode layer using wet and/or dry etching processes. In some embodiments, the gate electrode layer is etched using a combination of wet and dry etching processes. Examples of wet etching processes include the application of acidic, basic, or organic-solvent based solutions (depending on the material to be etched) to the gate electrode layer. Examples of dry etching processes include reactive ion etching (RIE), plasma etching, ion milling, and the like.

In step 206, a gate dielectric layer is deposited above the gate electrode layer. Typically, the gate dielectric is an insulating material such as a silicon oxide, silicon nitride, or a metal oxide such as aluminum oxide, and the like. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). In some embodiments, the deposition process is a vacuum-based process such as PVD, ALD, PE-ALD, AVD, UV-ALD, CVD, PECVD, PLD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 208, the gate dielectric layer is patterned. Optionally, an anneal step is implemented prior to patterning, post patterning, or both. The gate dielectric layer is patterned using known photolithography techniques followed by etching the gate dielectric layer using wet and/or dry etching processes. In some embodiments, the gate dielectric layer is etched using a combination of wet and dry etching processes. Examples of wet etching processes include the application of acidic, basic, or organic-solvent based solutions (depending on the material to be etched) to the gate dielectric layer. Examples of dry etching processes include reactive ion etching (RIE), plasma etching, ion milling, and the like.

In step 210, a metal-based semiconductor layer is deposited above the gate dielectric layer. Examples of suitable materials for the semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N (SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in IGZO may be partially or completely replaced by Ag, As, Au, Bi, Cd, Cu, Zn, Ga, Ge, Hg, In, Pb, Sb, Sn, and Tl. Other dopants of interest include halogens like Cl and F. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 212, the metal-based semiconductor layer is patterned. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the semiconductor layer may be treated prior to etch stopper or source/drain deposition with a plasma containing $O_2$ or $N_2O$. The metal-based semiconductor layer is patterned using known photolithography techniques followed by etching the metal-based semiconductor layer using wet and/or dry etching processes. In some embodiments, the metal-based semiconductor layer is etched using a combination of wet and dry etching processes. Examples of wet etching processes include the application of acidic, basic, or organic-solvent based solutions (depending on the material to be etched) to the metal-based semiconductor layer. Examples of dry etching processes include reactive ion etching (RIE), plasma etching, ion milling, and the like.

In step 214, an etch stop layer is deposited above the metal-based semiconductor layer. Examples of suitable materials for the etch stopper include silicon oxide, silicon nitride, a stack of silicon nitride and silicon oxide, a mixture, multi-layer, or combination thereof of a high bandgap material (e.g. silicon oxide, or aluminum oxide) and high-k dielectric material (e.g. hafnium oxide, zirconium oxide, titanium oxide), a high bandgap (e.g. silicon oxide, or aluminum oxide) or high-k dielectric material (e.g. hafnium oxide, zirconium oxide, titanium oxide). In addition to these inorganic materials, various organic materials may be used as etch stopper materials as well. Examples of organic etch stopper materials include photoresist, organic polymers, UV-curable polymers, and heat-curable polymers. In some embodiments, the deposition process is a vacuum-based process such as PVD, ALD, PE-ALD, AVD, UV-ALD, CVD, PECVD, PLD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 216, the etch stop layer is patterned. Optionally, an anneal step is implemented prior to patterning, post patterning, or both. The etch stop layer is patterned using known photolithography techniques followed by etching the etch stop layer using wet and/or dry etching processes. In some embodiments, the etch stop layer is etched using a combination of wet and dry etching processes. Examples of wet etching processes include the application of acidic, basic, or organic-solvent based solutions (depending on the material to be etched) to the etch stop layer. Examples of dry etching processes include reactive ion etching (RIE), plasma etching, ion milling, and the like. When dry processes are used, the upper surface of the underlying metal-based semiconductor layer may become damaged, negatively affecting the transport properties. This may require an additional step to remove a portion of the upper surface of the underlying metal-based semiconductor layer to recover the required transport properties.

In step 218, a source/drain electrode layer is deposited above the etch stop layer. The source and drain electrodes are typically deposited as a single layer and then defined during the patterning step. Typically, the source/drain electrode is a material with high conductivity such as a metal, metal alloy, or conductive metal compound (e.g. titanium nitride, tantalum nitride, and the like). Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The source/drain electrode layer can be deposited using well known deposition techniques such as PVD, CVD, PECVD, PLD, evaporation, etc.

In step 220, the source/drain electrode layer is patterned into individual source and drain electrodes. Optionally, an anneal step is implemented prior to patterning, post patterning, or both. The source/drain electrode layer is patterned using known photolithography techniques followed by etching the source/drain electrode layer using wet and/or dry etching processes. In some embodiments, the source/drain electrode layer is etched using a combination of wet and dry etching processes. Examples of wet etching processes include the application of acidic, basic, or organic-solvent based solutions (depending on the material to be etched) to the source/drain electrode layer. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. Examples of dry etching processes include reactive ion etching (RIE), plasma etching, ion milling, and the like. The performance of the source and drain electrodes can be sensitive to composition and process parameters.

In step 222, a passivation layer is deposited above the source/drain layer to form a TFT stack. Typically, the passivation layer is an insulating material such as a silicon oxide, silicon nitride, or a metal oxide such as aluminum oxide, and the like. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer can be deposited using well known deposition techniques such as PVD, CVD, PECVD, PLD, evaporation, etc.

In step 224, the TFT stack is annealed. The annealing serves to passivate defects that may have been formed during any of the deposition, previous anneal steps, and/or etching steps and also serves to control the number of oxygen vacancies that may have been formed in the metal-based semiconductor material. Pending combination of materials, process methods, and process conditions, the annealing might impact both bulk and interface properties, like doping concentrations (and type), defect concentrations (and type), film density (and related long-term durability), and therefore performance metrics like contact resistance, effective mobility, threshold voltage, and TFT stability. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. The annealing is typically performed in a temperature range between 150 C and 400 C for times between 10 minutes and 60 minutes.

In some embodiments, between one or more of the deposition and patterning steps discussed previously (e.g. the formation of the gate electrode layer, the gate dielectric layer, the metal-based semiconductor layer, the etch stopper layer, the source/drain electrode layers, or the passivation layer), the surface of the deposited film may be subjected to a treatment process before the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

The performance of the metal-based semiconductor layer will be sensitive to parameters such as composition, crystal structure, oxygen vacancies, surface defects, interface state density, and the like. Many of these parameters will be influenced by the processing of the material and the process conditions to which the material is exposed. As an example, in the method as outlined in FIG. 2, the metal-based semiconductor material is exposed to air (after deposition), photoresist and photoresist developer (during patterning), etch chemistries (either wet, dry, or both), processing conditions related to the deposition of the etch stop layer (e.g. elevated temperatures, plasma bombardment, etc.), processing conditions related to the patterning of the etch stop layer (either wet, dry, or both), and processing conditions related to the deposition of the source/drain layer (e.g. elevated temperatures, plasma bombardment, etc.). Those skilled in the art will understand that the active channel of the metal-based semiconductor layer is protected by the etch stop layer, but that regions of the metal-based semiconductor layer outside the active channel will be exposed to the processing conditions related to the deposition of the source/drain layer.

FIG. 3 is a simplified cross-sectional view of a TFT according to some embodiments. Gate electrode, 304, is formed above substrate, 302. As discussed previously, the substrate may be any commonly used substrate for display devices such as one of float glass, low-iron glass, borosilicate glass, display glass, alkaline earth boro-aluminosilicate glass, fusion drawn glass, flexible glass, specialty glass for high temperature processing, polyimide, plastics, PET, etc. for either applications requiring transparent or non-transparent substrate functionality. For substrates with no need for transparency, substrates like aluminum foil, stainless steel, carbon steel, paper, cladded foils, etc. can be utilized. The substrate optionally is covered by a diffusion barrier, (e.g. silicon oxide, silicon nitride, or silicon oxy-nitride). The bottom gate electrode, 304, is typically formed by a deposition process followed by a patterning process. Optionally, an anneal step is implemented prior to patterning, post patterning, or both. A typical deposition method involves sputter deposition. Patterning is typically performed by photolithography. The photolithography most commonly relies on wet etching, yet dry etching (e.g. reactive ion etching) can be used as well. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The gate electrode is most commonly a stack of two or more layers. Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode.

Gate dielectric, 306, is formed above bottom gate electrode, 304. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The gate dielectric, 306, is typically formed by a deposition process followed by a patterning process. Optionally, an anneal step is implemented prior to patterning, post patterning, or both. The gate dielectric, 306, may be formed using deposition techniques such as PVD, ALD, or PECVD, or a combination thereof. The performance of the gate dielectric can be sensitive to composition and process parameters. The gate dielectric, 306, may be patterned using either wet techniques such as chemical etching, or dry techniques such as reactive ion etching (RIE). In both of these techniques, parameters such as the uniformity, etch rate, selectivity, critical dimension loss, taper angle, cost, throughput, etc. are sensitive to the process parameters of the etch process.

Metal-based semiconductor layer, 308, is formed above gate dielectric, 106. The metal-based semiconductor layer, 308, is typically formed by a deposition process followed by a patterning process. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the metal-based semiconductor layer may be treated prior to etch stopper or source/drain deposition with a plasma containing $O_2$ or $N_2O$. The metal-based semiconductor layer, 308, may be formed using deposition techniques such as PVD, MOCVD, or wet depositions, (e.g. based on sol-gels). The performance of the metal-based semiconductor layer can be sensitive to composition and process parameters. Examples of suitable materials for the metal-based semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N (SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in the metal-based semiconductor material (e.g. IGZO) may be partially or completely replaced by Ag, As, Au, Bi, Cd, Cu, Zn, Ga, Ge, Hg, In, Pb, Sb, Sn, and Tl. Other dopants of interest include halogens like Cl and F. The metal-based semiconductor layer, 308, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process. This disclosure will use IGZO as an example, but this is not meant to be limiting. The techniques described herein can be applied to any material suitable for display applications.

Source and drain electrodes, 312 and 314, are formed above the metal-based semiconductor layer, 308. The source and drain electrodes, 312 and 314, are typically formed by a deposition process followed by a patterning process. Optionally, an anneal step is implemented prior to patterning, post patterning, or both. The source and drain electrodes, 312 and 314, may be formed using deposition techniques such as PVD, wet deposition (e.g. plating), or MOCVD (for TCOs). Typically, the deposition steps involve sputter deposition. Patterning is commonly performed by photolithography. The photolithography most commonly relies on wet etching, yet dry etching (e.g. reactive ion etching) can be used as well. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The performance of the source and drain electrodes can be sensitive to composition and process parameters. The gate electrode is most commonly a stack of two or more layers. Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The source and drain electrodes, 312 and 314, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

Passivation layer, 316, is formed above source and drain electrodes, 312 and 314. The passivation layer, 316, is typically formed by a deposition process followed by a patterning process. Optionally, an anneal step is implemented prior to patterning, post patterning, or both. The passivation layer, 316, may be formed using deposition techniques such as PVD, ALD, or PECVD, or by wet coating techniques. The performance of the passivation layer can be sensitive to composition and process parameters. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer, 316, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

In some embodiments, between one or more of the deposition and patterning steps discussed previously (e.g. the formation of the gate electrode layer, the gate dielectric layer, the metal-based semiconductor layer, the etch stopper layer, the source/drain electrode layers, or the passivation layer), the surface of the deposited film may be subjected to a treatment process before the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

Figure 4:
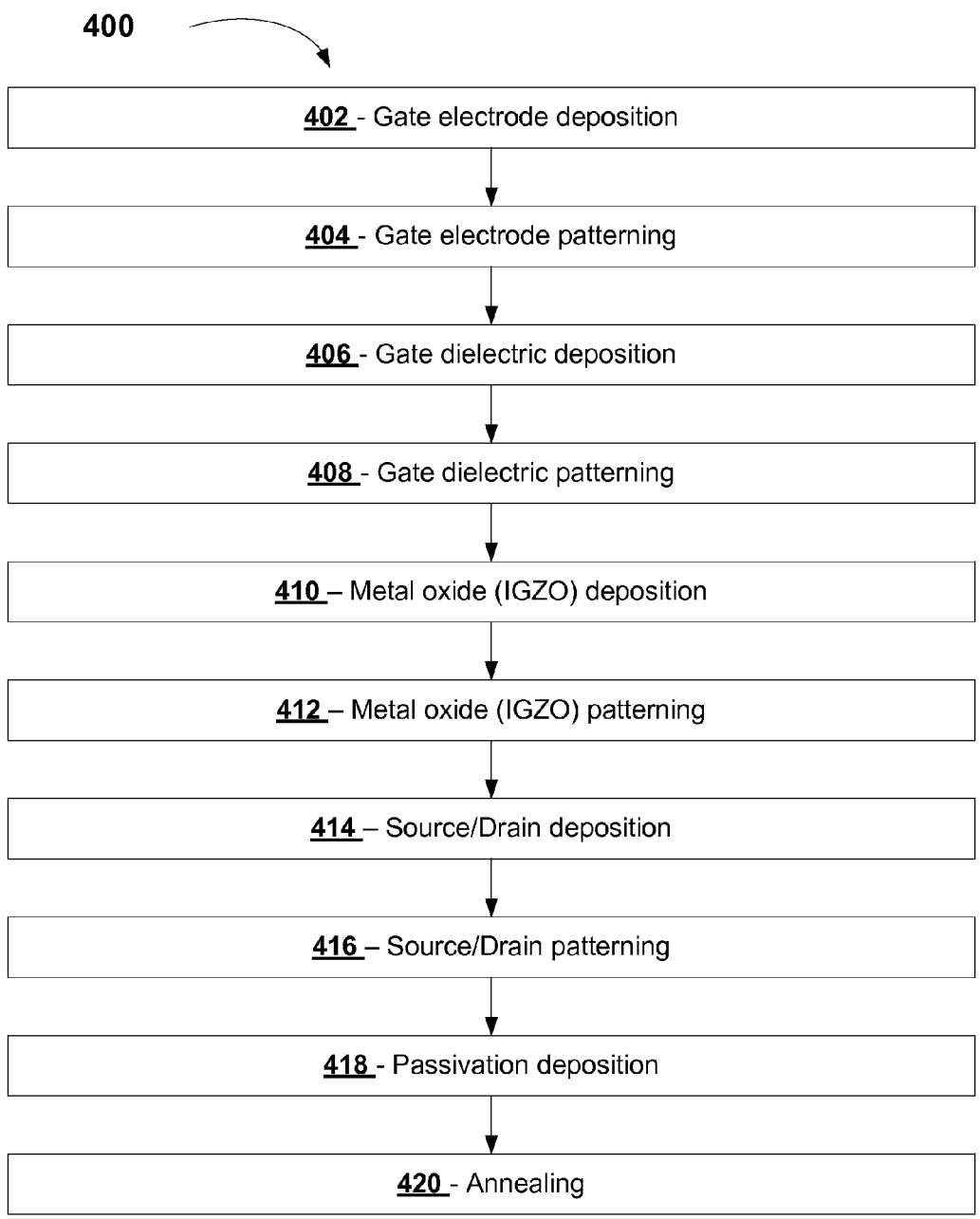
FIG. 4 is a flow chart illustrating the steps of a method according to some embodiments.

FIG. 4 is a flow chart illustrating the steps of a method according to some embodiments. In step 402, a gate electrode layer is deposited above the substrate. Typically, the gate electrode is a material with high conductivity such as a metal, metal alloy, or conductive metal compound (e.g. titanium nitride, tantalum nitride, and the like). Examples of suitable materials for the gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode. The gate electrode layer can be deposited using well known deposition techniques such as PVD, CVD, PECVD, PLD, evaporation, etc.

In step 404, the gate electrode layer is patterned. The gate electrode layer is patterned using known photolithography techniques followed by etching the gate electrode layer using wet and/or dry etching processes. In some embodiments, the gate electrode layer is etched using a combination of wet and dry etching processes. Examples of wet etching processes include the application of acidic, basic, or organic-solvent based solutions (depending on the material to be etched) to the gate electrode layer. Examples of dry etching processes include reactive ion etching (RIE), plasma etching, ion milling, and the like.

In step 406, a gate dielectric layer is deposited above the gate electrode layer. Typically, the gate dielectric is an insulating material such as a silicon oxide, silicon nitride, or a metal oxide such as aluminum oxide, and the like. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). In some embodiments, the deposition process is a vacuum-based process such as PVD, ALD, PE-ALD, AVD, UV-ALD, CVD, PECVD, PLD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 408, the gate dielectric layer is patterned. Optionally, an anneal step is implemented prior to patterning, post patterning, or both. The gate dielectric layer is patterned using known photolithography techniques followed by etching the gate dielectric layer using wet and/or dry etching processes. In some embodiments, the gate dielectric layer is etched using a combination of wet and dry etching processes. Examples of wet etching processes include the application of acidic, basic, or organic-solvent based solutions (depending on the material to be etched) to the gate dielectric layer. Examples of dry etching processes include reactive ion etching (RIE), plasma etching, ion milling, and the like.

In step 410, a metal-based semiconductor layer is deposited above the gate dielectric layer. Examples of suitable materials for the semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N (SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in IGZO may be partially or completely replaced by Ag, As, Au, Bi, Cd, Cu, Zn, Ga, Ge, Hg, In, Pb, Sb, Sn, and Tl. Other dopants of interest include halogens like Cl and F. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 412, the metal-based semiconductor layer is patterned. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the semiconductor layer may be treated prior to etch stopper or source/drain deposition with a plasma containing $O_2$ or $N_2O$. The metal-based semiconductor layer is patterned using known photolithography techniques followed by etching the metal-based semiconductor layer using wet and/or dry etching processes. In some embodiments, the metal-based semiconductor layer is etched using a combination of wet and dry etching processes. Examples of wet etching processes include the application of acidic, basic, or organic-solvent based solutions (depending on the material to be etched) to the metal-based semiconductor layer. Examples of dry etching processes include reactive ion etching (RIE), plasma etching, ion milling, and the like.

In step 414, a source/drain electrode layer is deposited above the etch stop layer. The source and drain electrodes are typically deposited as a single layer and then defined during the patterning step. Typically, the source/drain electrode is a material with high conductivity such as a metal, metal alloy, or conductive metal compound (e.g. titanium nitride, tantalum nitride, and the like). Examples of suitable materials for the source/drain electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The source/drain electrode layer can be deposited using well known deposition techniques such as PVD, CVD, PECVD, PLD, evaporation, etc.

In step 416, the source/drain electrode layer is patterned into individual source and drain electrodes. Optionally, an anneal step is implemented prior to patterning, post patterning, or both. The source/drain electrode layer is patterned using known photolithography techniques followed by etching the source/drain electrode layer using wet and/or dry etching processes. In some embodiments, the source/drain electrode layer is etched using a combination of wet and dry etching processes. Examples of wet etching processes include the application of acidic, basic, or organic-solvent based solutions (depending on the material to be etched) to the source/drain electrode layer. Wet etch chemistries are most commonly aqueous, and include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. Examples of dry etching processes include reactive ion etching (RIE), plasma etching, ion milling, and the like. The performance of the source and drain electrodes can be sensitive to composition and process parameters.

Optionally, a thin layer of the active channel of the metal-based semiconductor layer is removed after the patterning of the source/drain layer to remove damage introduced during processing (not shown).

In step 418, a passivation layer is deposited above the source/drain layer to form a TFT stack. Typically, the passivation layer is an insulating material such as a silicon oxide, silicon nitride, or a metal oxide such as aluminum oxide, and the like. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer can be deposited using well known deposition techniques such as PVD, CVD, PECVD, PLD, evaporation, etc.

In step 420, the TFT stack is annealed. The annealing serves to passivate defects that may have been formed during any of the deposition and/or etching steps and also serves to reduce the number of oxygen vacancies that may have been formed in the metal-based semiconductor material. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. The annealing is typically performed in a temperature range between 150 C and 400 C for times between 10 minutes and 60 minutes.

In some embodiments, between one or more of the deposition and patterning steps discussed previously (e.g. the formation of the gate electrode layer, the gate dielectric layer, the metal-based semiconductor layer, the etch stopper layer, the source/drain electrode layers, or the passivation layer), the surface of the deposited film may be subjected to a treatment process before the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

The performance of the metal-based semiconductor layer will be sensitive to parameters such as composition, crystal structure, oxygen vacancies, surface defects, interface state density, and the like. Many of these parameters will be influenced by the processing of the material and the process conditions to which the material is exposed. As an example, in the method as outlined in FIG. 4, the metal-based semiconductor material is exposed to air (after deposition), photoresist and photoresist developer (during patterning), etch chemistries (either wet, dry, or both), processing conditions related to the deposition of the source/drain layer (e.g. elevated temperatures, plasma bombardment, etc.), and processing conditions related to the patterning of the source/drain layer (either wet, dry, or both). Those skilled in the art will understand that the active channel of the metal-based semiconductor layer is exposed to all of these processing conditions. As discussed previously, typically, a thin layer of the active channel of the metal-based semiconductor layer is removed after the patterning of the source/drain layer to remove damage introduced during processing.

In some embodiments, the metal-based semiconductor layer is based on an IGZO material. Some of these materials exhibit stable amorphous phases, high mobility (e.g. >5 $cm^2$/Vs), low threshold voltage (close to zero, e.g. in a range of −1.0V to +2.0V), low carrier concentrations (e.g. $10^{16}$-$10^{17}$ $cm^{-3}$), high ON/OFF current ratios (e.g. >$10^6$), and high durability (e.g. negative bias temperature illumination stress NBTIS with threshold voltage shift in a range of −1.5V to +0.5V). However, since these materials are multinary compounds (e.g. three or more elements), their performance and properties are sensitive to factors such as composition, concentration gradients, deposition parameters, post-deposition treatments, interactions with adjacent materials, and the like.

During the operation of the TFT, negative gate voltage (e.g. −3V) is applied to turn the TFT OFF. A small amount of leakage current (e.g. leakage current density in the mid $10^{-4}$ $A/cm^2$) may be present. Further, the leakage current is present in the upper portion of the metal-based semiconductor material, near the interface with the source and drain electrodes. It is desirable for the metal-based semiconductor material to have a low conductivity (i.e. high resistivity) under conditions of negative gate voltage, especially at the interface with the source and drain electrodes.

The TFT may be turned ON by applying a positive gate voltage (e.g. +10V). Under these conditions, the current flowing through the TFT can be high (e.g. current density in the mid $10^{+4}$ $A/cm^2$). Further, the current is present in the lower portion of the metal-based semiconductor material, near the interface with the gate dielectric material. It is desirable for the metal-based semiconductor material to have a high conductivity (i.e. low resistivity) under conditions of positive gate voltage, especially at the interface with the gate dielectric material.

The electrical properties of metal-based semiconductor materials may vary as a function of the concentration of one or more of the elements. As an example, the conductivity of IGZO materials is lower when the Ga concentration is higher. Conversely, the conductivity of IGZO materials increases at lower Ga concentrations. Similar relations for multinary metal oxide based semiconductors apply when changing the composition of Al, Hf, and the like in IGZO-like materials where Ga has been partially or completely replaced by Al, Hf, and the like. As an example, the properties of Hf—In—Zn—O (HIZO) can be altered by changing the Hf concentration through the thickness of the film. As an example, the properties of Al—Zn—Sn—O (AZTO) can be altered by changing the Al concentration through the thickness of the film.

In some embodiments, the concentration of one or more of the elements of the metal-based semiconductor material is varied as the material is formed. In some embodiments, one or more elements of the metal-based semiconductor material that are known to impact (e.g. increase) the conductivity of the metal-based semiconductor material are distributed with a gradient throughout the depth of the metal-based semiconductor layer. In some embodiments, the concentration(s) of these element(s) may be lower at the interface between the metal-based semiconductor layer and the gate dielectric layer. In some embodiments, the concentration(s) of these element(s) may be higher at the interface between the metal-based semiconductor layer and the source and drain electrodes.

The metal-based semiconductor layer may be deposited using any known deposition technique. Typical deposition techniques include PVD and PECVD, however, other deposition techniques such as CVD, ALD, evaporation, and the like could also be used. The concentration(s) of the one or more elements may be varied throughout the depth of the metal-based semiconductor layer by varying one or more processing parameters throughout the deposition. Typical examples would be a change in composition of sputter targets from start to finish in an in-line PVD tool, or a change in gas composition over time for a batch process like PECVD. Other examples of suitable deposition parameters that can be varied to impact composition through the thickness (depth) of the film include power, pressure, substrate distance from the source, gas flow, gas flow composition, and the like. This list is not meant to be limiting and those skilled in the art will understand the relevant processing parameters for each of the deposition techniques employed.

In some embodiments, the processing parameters may be varied throughout the deposition so that the concentration(s) of the one or more elements exhibits one of a linear profile, stepped profile, parabolic profile, or exponential profile from the lower surface to the upper surface of the layer. These are exemplary profiles and those skilled in the art would be able to devise suitable profiles, depending on the desired result, without undue experimentation. In some embodiments, the concentration(s) of the one or more elements exhibit a single gradient (e.g. single grading) wherein the concentration is higher at one interface than the other. In some embodiments, the concentration(s) of the one or more elements exhibit a double gradient (e.g. double grading) wherein the concentration is higher at both of the interfaces. This results in the concentration(s) of the one or more elements being lower in the middle region of the layer than at each of the interfaces. The concentration(s) of the one or more elements at the interfaces may be the same or may be different.

In some embodiments, the metal-based semiconductor material is IGZO. The concentration of one or more of the elements of the IGZO is varied as the material is formed. In some embodiments, one or more elements of the IGZO material that are known to impact (e.g. increase) the conductivity of the IGZO material are formed with a gradient throughout the depth of the IGZO layer. Ga is one such element that will alter the conductivity of IGZO as a function of its concentration. There may be other elements that are also varied through the depth of the layer. In some embodiments, the concentration(s) of Ga (and/or other elements) is lower at the interface between the IGZO layer and the gate dielectric layer. In some embodiments, the concentration(s) of Ga (and/or other elements) is higher at the interface between the IGZO layer and the source and drain electrodes.

The IGZO layer may be deposited using any known deposition technique. Typical deposition techniques include PVD and PECVD, however, other deposition techniques such as CVD, ALD, evaporation, and the like could also be used. The concentration(s) of the Ga (and/or other elements) may be varied throughout the depth of the IGZO layer by varying one or more processing parameters throughout the deposition. Most typical examples would be a change in composition of sputter targets from start to finish in an in-line PVD tool, or a change in gas composition over time for a batch process like PECVD. Other examples of suitable deposition parameters that can be varied to impact composition through the thickness (depth) of the film include power, pressure, substrate distance from the source, gas flow, gas flow composition, and the like. This list is not meant to be limiting and those skilled in the art will understand the relevant processing parameters for each of the deposition techniques employed.

In high volume manufacturing, the IGZO layer is typically deposited using a PVD (sputtering) process. The deposition system may be a batch system or an in-line system, but the in-line system is preferred due to higher throughput and lower cost of ownership. The in-line system may be continuous (i.e. the substrates move continuously through the system) or the in-line system may use a "stop and soak" process wherein the substrates are transported to a process station where they stop until the process is completed. In-line systems typically include a number of process stations to allow different compositions to be deposited or to break a long deposition cycle into smaller, balanced, deposition cycles to increase the overall equipment efficiency of the system. At each process station, the substrate may be subjected to small translational oscillations to improve the uniformity of the deposition. This oscillation is not considered part of the transport of the substrate.

Figure 5:
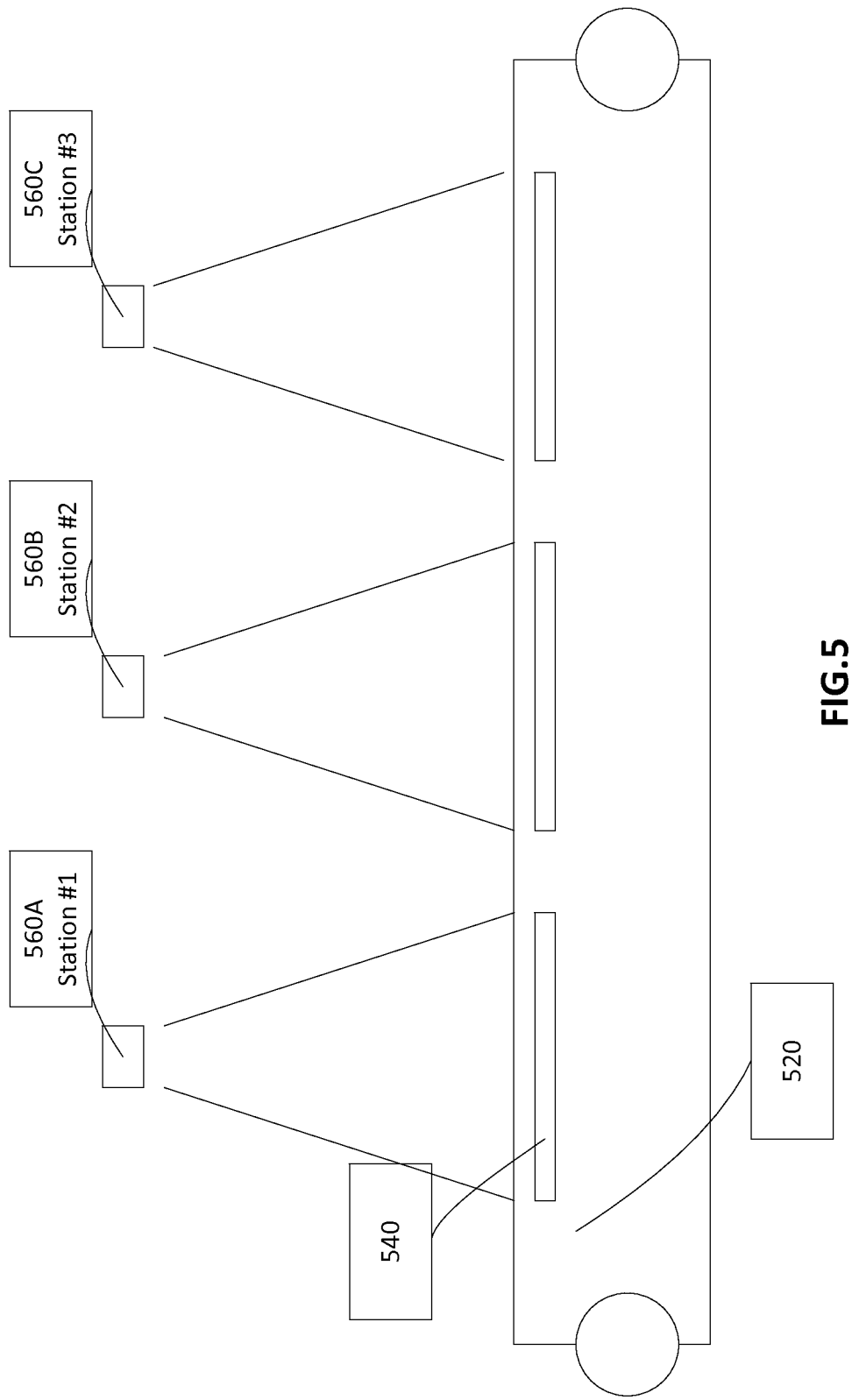
FIG. 5 is a schematic of a system used to deposit layers in accordance with some embodiments.

FIG. 5 illustrates an exemplary in-line deposition (e.g. sputtering) system according to some embodiments. FIG. 5 illustrates a system with three deposition stations, but those skilled in the art will understand that any number of deposition stations can be supplied in the system. For example, the three deposition stations illustrated in FIG. 5 can be repeated and provide systems with 6, 9, 12, etc. targets, limited only by the desired layer deposition sequence and the throughput of the system. A transport mechanism 520, such as a conveyor belt or a plurality of rollers, can transfer substrate 540 between different deposition stations. For example, the substrate can be positioned at station #1, comprising a target assembly 560A, then transferred to station #2, comprising target assembly 560B, and then transferred to station #3, comprising target assembly 560C. Station #1 can be configured to deposit an IGZO layer. Station #2 can be configured to deposit an additional IGZO layer with the same or different composition. Station #3 can be configured to deposit an additional IGZO layer with the same or different composition.

In some embodiments, the processing parameters may be varied throughout the deposition so that the concentration(s) of the Ga (and/or other elements) exhibits one of a linear profile, stepped profile, parabolic profile, or exponential profile. These are exemplary profiles and those skilled in the art would be able to devise suitable profiles, depending on the desired result, without undue experimentation. In some embodiments, the concentration(s) of the one or more elements exhibit a single gradient (e.g. single grading) wherein the concentration is higher at one interface than the other. In some embodiments, the concentration(s) of the one or more elements exhibit a double gradient (e.g. double grading) wherein the concentration is higher at both of the interfaces. This results in the concentration(s) of the one or more elements being lower in the middle region of the layer than at each of the interfaces. The concentration(s) of the one or more elements at the interfaces may be the same or may be different.

In some embodiments, the concentration ratio of the Ga to In in the IGZO (e.g. Ga/In) is between 1 and 2 at the upper surface (e.g. the interface to the source and drain electrodes). In some embodiments, the concentration ratio of the Ga to Zn in the IGZO (e.g. Ga/Zn) is between 1.5 and 4 at the upper surface (e.g. the interface to the source and drain electrodes). This results in an IGZO material near the top of the layer that has a low conductivity (e.g. high resistivity). As discussed previously, when the TFT is in the OFF state, the leakage current density is concentrated near the interface between the IGZO and the source and drain electrodes. By forming an IGZO material with a higher Ga concentration near this interface, the leakage current can be further decreased, leading to reduced power consumption for the device.

In some embodiments, the concentration ratio of the Ga to In in the IGZO (e.g. Ga/In) is between 0.5 and 1 at the lower surface (e.g. the interface to the gate dielectric layer). In some embodiments, the concentration ratio of the Ga to Zn in the IGZO (e.g. Ga/Zn) is between 0.5 and 1 at the lower surface (e.g. the interface to the gate dielectric layer). This results in an IGZO material near the bottom of the layer that has a high conductivity (e.g. low resistivity). As discussed previously, when the TFT is in the ON state, the current density is concentrated near the interface between the IGZO and the gate dielectric layer. By forming an IGZO material with a lower Ga concentration near this interface, the current can be further increased, leading to faster speed for the device.

Figure 6:
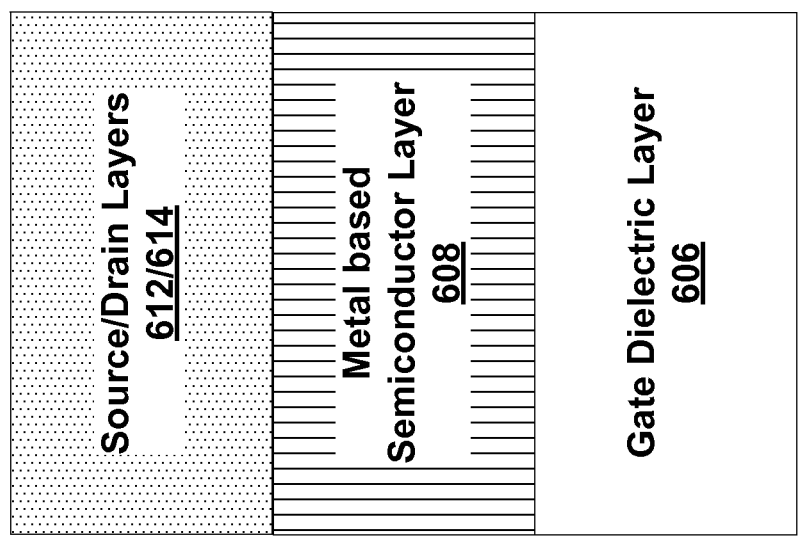
FIG. 6 is a simplified cross-sectional view of a TFT stack according to some embodiments.
Figure 6:
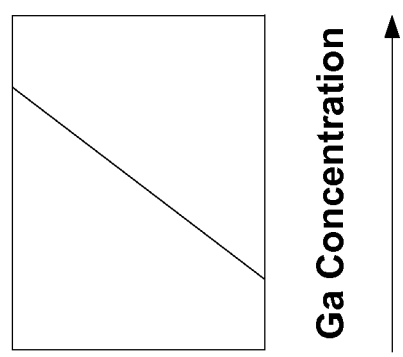

FIG. 6 is a simplified cross-sectional view of a TFT stack according to some embodiments. In some embodiments the metal-based semiconductor layer is IGZO. The concentration of one or more of the elements of the IGZO is varied as the layer is formed (e.g. a concentration gradient is formed between the lower surface of the layer and the upper surface of the layer). In some embodiments, one or more elements of the IGZO material that are known to impact (e.g. increase) the conductivity of the IGZO material are formed with a gradient throughout the depth of the IGZO layer. Ga is one such element that will alter the conductivity of IGZO as a function of its concentration. There may be other elements that are also varied through the depth of the layer. In some embodiments, the concentration(s) of Ga (and/or other elements) is lower at the interface between the IGZO layer and the gate dielectric layer. In some embodiments, the concentration(s) of Ga (and/or other elements) is higher at the interface between the IGZO layer and the source and drain electrodes. In FIG. 6, the Ga concentration is illustrated as varying in a linear manner between the lower surface (e.g. the interface to the gate dielectric layer) and the upper surface (e.g. the interface to the source and drain electrodes). As discussed previously, the properties of other metal based semiconductor materials (e.g. HIZO, AZTO, etc.) can be altered by varying the concentration of one or more of the metals throughout the thickness of the layer.

Figure 7:
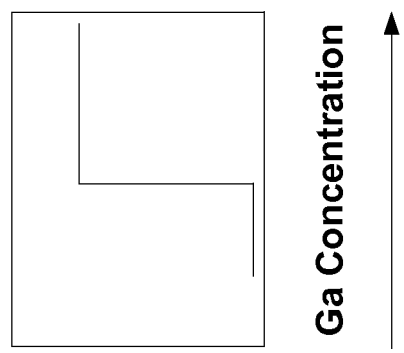
FIG. 7 is a simplified cross-sectional view of a TFT stack according to some embodiments.
Figure 7:
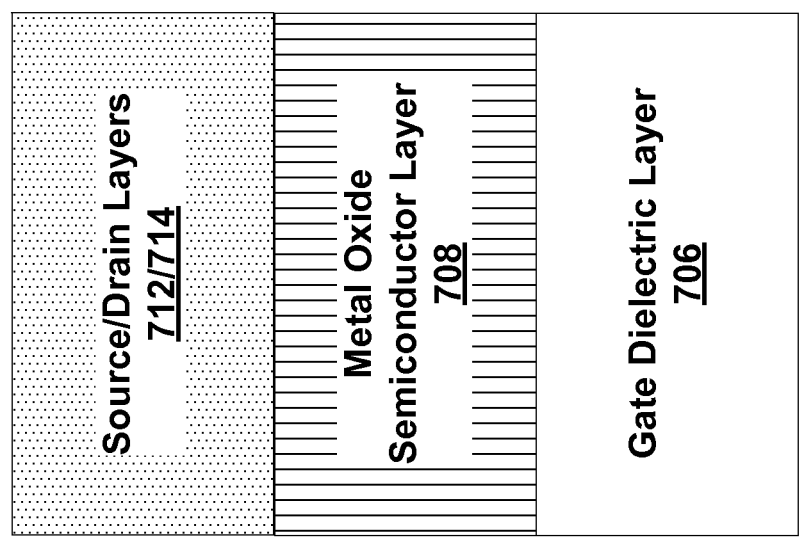

FIG. 7 is a simplified cross-sectional view of a TFT stack according to some embodiments. In some embodiments the metal-based semiconductor material is IGZO. The concentration of one or more of the elements of the IGZO is varied as the material is formed. In some embodiments, one or more elements of the IGZO material that are known to impact (e.g. increase) the conductivity of the IGZO material are formed with a gradient throughout the depth of the IGZO layer. Ga is one such element that will alter the conductivity of IGZO as a function of its concentration. There may be other elements that are also varied through the depth of the layer. In some embodiments, the concentration(s) of Ga (and/or other elements) is lower at the interface between the IGZO layer and the gate dielectric layer. In some embodiments, the concentration(s) of Ga (and/or other elements) is higher at the interface between the IGZO layer and the source and drain electrodes. In FIG. 7, the Ga concentration is illustrated as varying in a stepped manner between the lower surface (e.g. the interface to the gate dielectric layer) and the upper surface (e.g. the interface to the source and drain electrodes). As discussed previously, the properties of other metal based semiconductor materials (e.g. HIZO, AZTO, etc.) can be altered by varying the concentration of one or more of the metals throughout the thickness of the layer.

Figure 8:
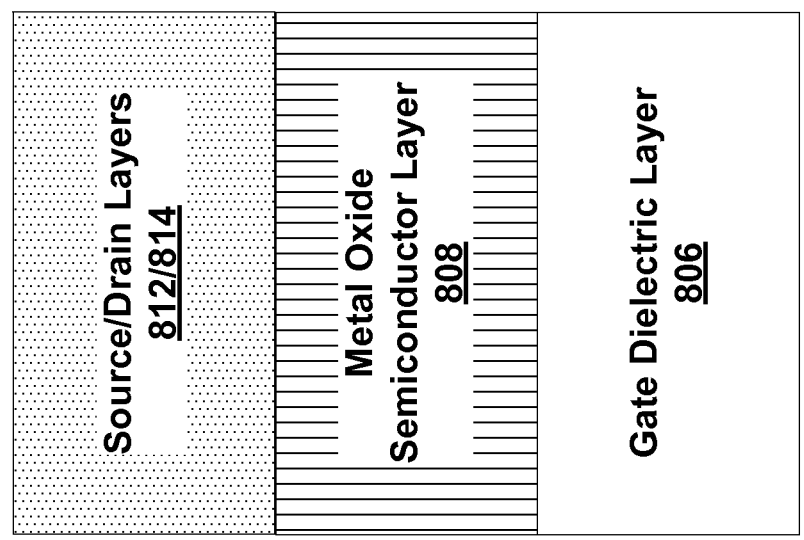
FIG. 8 is a simplified cross-sectional view of a TFT stack according to some embodiments.
Figure 8:
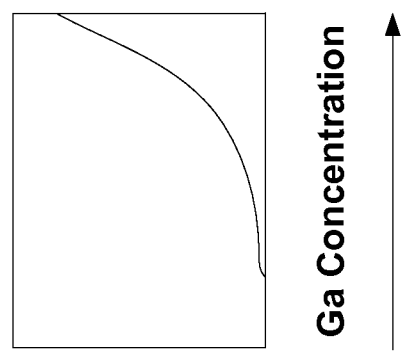

FIG. 8 is a simplified cross-sectional view of a TFT stack according to some embodiments. In some embodiments the metal-based semiconductor material is IGZO. The concentration of one or more of the elements of the IGZO is varied as the material is formed. In some embodiments, one or more elements of the IGZO material that are known to impact (e.g. increase) the conductivity of the IGZO material are formed with a gradient throughout the depth of the IGZO layer. Ga is one such element that will alter the conductivity of IGZO as a function of its concentration. There may be other elements that are also varied through the depth of the layer. In some embodiments, the concentration(s) of Ga (and/or other elements) is lower at the interface between the IGZO layer and the gate dielectric layer. In some embodiments, the concentration(s) of Ga (and/or other elements) is higher at the interface between the IGZO layer and the source and drain electrodes. In FIG. 8, the Ga concentration is illustrated as varying in a parabolic manner between the lower surface (e.g. the interface to the gate dielectric layer) and the upper surface (e.g. the interface to the source and drain electrodes). As discussed previously, the properties of other metal based semiconductor materials (e.g. HIZO, AZTO, etc.) can be altered by varying the concentration of one or more of the metals throughout the thickness of the layer.

Figure 9:
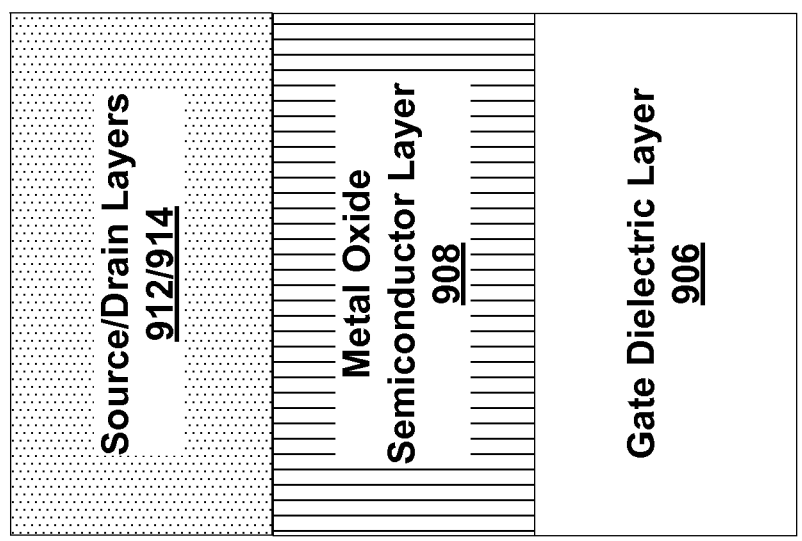
FIG. 9 is a simplified cross-sectional view of a TFT stack according to some embodiments.
Figure 9:
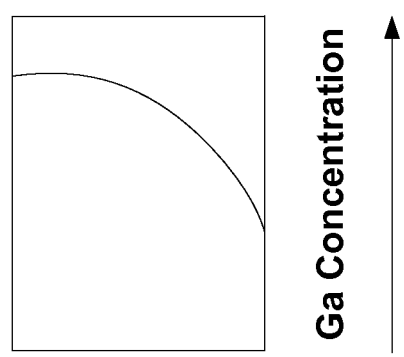

FIG. 9 is a simplified cross-sectional view of a TFT stack according to some embodiments. In some embodiments the metal-based semiconductor material is IGZO. The concentration of one or more of the elements of the IGZO is varied as the material is formed. In some embodiments, one or more elements of the IGZO material that are known to impact (e.g. increase) the conductivity of the IGZO material are formed with a gradient throughout the depth of the IGZO layer. Ga is one such element that will alter the conductivity of IGZO as a function of its concentration. There may be other elements that are also varied through the depth of the layer. In some embodiments, the concentration(s) of Ga (and/or other elements) is lower at the interface between the IGZO layer and the gate dielectric layer. In some embodiments, the concentration(s) of Ga (and/or other elements) is higher at the interface between the IGZO layer and the source and drain electrodes. In FIG. 9, the Ga concentration is illustrated as varying in an exponential manner between the lower surface (e.g. the interface to the gate dielectric layer) and the upper surface (e.g. the interface to the source and drain electrodes). As discussed previously, the properties of other metal based semiconductor materials (e.g. HIZO, AZTO, etc.) can be altered by varying the concentration of one or more of the metals throughout the thickness of the layer.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method comprising:
providing a substrate;
forming a metal-based semiconductor layer above a surface of the substrate,
wherein the metal-based semiconductor layer comprises two or more elements;
wherein the metal-based semiconductor layer has a lower surface and an upper surface, and
wherein at least one element of the metal-based semiconductor layer is varied in concentration from the lower surface to the upper surface during the forming.

2. The method of claim 1, wherein the metal-based semiconductor layer comprises indium, gallium, zinc, and oxygen.

3. The method of claim 1, wherein the metal-based semiconductor layer is operable as a semiconductor layer in a thin film transistor device, and further comprising:
forming a gate electrode layer above the surface of the substrate, wherein the metal-based semiconductor layer is formed above the gate electrode;
forming a gate dielectric layer above the gate electrode layer, wherein the metal-based semiconductor layer is formed above the gate dielectric layer; and
forming a source electrode and a drain electrode above the metal-based semiconductor layer.

4. The method of claim 3, wherein the metal-based semiconductor layer is formed using a deposition technique, the deposition technique comprising least one of physical vapor deposition (PVD), chemical vapor deposition (CVD), plasma enhanced chemical vapor deposition (PECVD), atomic layer deposition (ALD), and evaporation, and further comprising varying a deposition parameter of the deposition technique during the forming of the metal-based semiconductor layer.

5. The method of claim 1, wherein the deposition technique comprises PVD, and the deposition parameter comprises at least one of a composition of sputter targets, a power supplied to the sputter targets, a gaseous pressure within a PVD chamber in which the PVD occurs, a flow rate of gas within the PVD chamber, a composition of the gas within the PVD chamber, a distance between the sputter targets and the substrate, a flow rate, or a combination thereof.

6. The method of claim 1, wherein the metal-based semiconductor layer comprises gallium and a concentration of the gallium is lower at the lower surface of the metal-based semiconductor layer.

7. The method of claim 1, wherein the metal-based semiconductor layer comprises gallium and a concentration of the gallium varies in a linear manner from the lower surface of the metal-based semiconductor layer to the upper surface of the metal-based semiconductor layer.

8. The method of claim 1, wherein the metal-based semiconductor layer comprises gallium and a concentration of the gallium varies in a stepped manner from the lower surface of the metal-based semiconductor layer to the upper surface of the metal-based semiconductor layer.

9. The method of claim 1, wherein the metal-based semiconductor layer comprises gallium and a concentration of the gallium varies in a parabolic manner from the lower surface of the metal-based semiconductor layer to the upper surface of the metal-based semiconductor layer.

10. The method of claim 1, wherein the metal-based semiconductor layer comprises gallium and a concentration of the gallium varies in an exponential manner from the lower surface of the metal-based semiconductor layer to the upper surface of the metal-based semiconductor layer.

11. A thin film transistor device comprising:
a substrate;
a metal-based semiconductor layer above a surface of the substrate,
wherein the metal-based semiconductor layer comprises two or more elements;
wherein the metal-based semiconductor layer has a lower surface and an upper surface, and
wherein at least one element of the metal-based semiconductor layer varies in concentration from the lower surface to the upper surface of the metal-based semiconductor layer.

12. The thin film transistor device of claim 11, wherein the metal-based semiconductor layer comprises indium, gallium, zinc, and oxygen.

13. The thin film transistor device of claim 11, wherein the metal-based semiconductor layer is operable as a semiconductor layer in the thin film transistor device.

14. The thin film transistor device of claim 13, wherein the thin film transistor device is operable as a transistor in a display device.

15. The thin film transistor device of claim 11, wherein the metal-based semiconductor layer comprises gallium and a concentration of the gallium is lower at the lower surface of the metal-based semiconductor layer.

16. The thin film transistor device of claim 11, wherein the metal-based semiconductor layer comprises gallium and a concentration of the gallium varies in a linear manner from the lower surface of the metal-based semiconductor layer to the upper surface of the metal-based semiconductor layer.

17. The thin film transistor device of claim 11, wherein the metal-based semiconductor layer comprises gallium and a concentration of the gallium varies in a stepped manner from the lower surface of the metal-based semiconductor layer to the upper surface of the metal-based semiconductor layer.

18. The thin film transistor device of claim 11, wherein the metal-based semiconductor layer comprises gallium and a concentration of the gallium varies in a parabolic manner from the lower surface of the metal-based semiconductor layer to the upper surface of the metal-based semiconductor layer.

19. The thin film transistor device of claim 11, wherein the metal-based semiconductor layer comprises gallium and a concentration of the gallium varies in an exponential manner from the lower surface of the metal-based semiconductor layer to the upper surface of the metal-based semiconductor layer.

20. The thin film transistor device of claim 11, wherein the metal-based semiconductor layer is deposited by one of physical vapor deposition (PVD), chemical vapor deposition (CVD), plasma enhanced chemical vapor deposition (PECVD), or atomic layer deposition (ALD).

* * * * *